(12) United States Patent
Kwong et al.

(10) Patent No.: US 6,303,520 B1
(45) Date of Patent: Oct. 16, 2001

(54) SILICON OXYNITRIDE FILM

(75) Inventors: Dim-Lee Kwong, Austin, TX (US);
Steven D. Marcus, Tempe, AZ (US);
Jeff Gelpey, Peabody, MA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 09/212,495

(22) Filed: Dec. 15, 1998

(51) Int. Cl.⁷ .................................................. H01L 21/44
(52) U.S. Cl. ...................... 438/769; 438/786; 438/790; 438/791; 438/794; 438/795; 438/410
(58) Field of Search ................................. 438/769, 786, 438/790, 794, 791, 795, 910

(56) References Cited

U.S. PATENT DOCUMENTS

| | | | |
|---|---|---|---|
| 4,623,912 | 11/1986 | Chang et al. | 357/54 |
| 5,861,651 | 1/1999 | Brasen et al. | |
| 5,904,523 | 5/1999 | Feldman et al. | |
| 5,970,384 | * 10/1999 | Yamazaki et al. | 438/795 |
| 5,976,991 | * 6/1998 | Laxman et al. | 438/786 |
| 6,083,852 | * 7/2000 | Cheung et al. | 438/791 |

FOREIGN PATENT DOCUMENTS

| | | |
|---|---|---|
| 0 010 910A | 3/1995 | (EP) . |
| 43 33 160A | 3/1995 | (DE) . |
| WO 98/27580 | 6/1998 | (WO) . |

OTHER PUBLICATIONS

S. V. Hattangady et al, "Controlled nitrogen incorporation at the gate oxide surface" Appl. Phys. Lett. vol. 66 3495, Jun. 19, 1995.

M. L Green et al. Ultrathin $SiO_xN_y$ by rapid thermal heating of silicon in $N_2$ at T = 760–1050 °C Appl. Phys Lett 71 (20), Nov. 17, 1977.

* cited by examiner

*Primary Examiner*—David Nelms
*Assistant Examiner*—Reneé R Berry
(74) *Attorney, Agent, or Firm*—Rodney T. Hodgson

(57) ABSTRACT

An oxynitride film on the surface of a silicon or silicon germanium substrate is described where film is substantially an oxide film at the film oxide interface, and the nitrogen content of the film increases with the distance away from the substrate. The film is made by a process of rapidly processing a clean silicon wafer in an atmosphere of a nitrogen containing gas containing a very small percentage of oxygen containing gas.

10 Claims, 3 Drawing Sheets

SILICON OXYNITRIDE FILM

FIELD OF THE INVENTION

The present invention relates to an improved insulating film on silicon or silicon-germanium, and a method of making such a film, which has improved characteristics for gate dielectric material in semiconductor devices.

BACKGROUND OF THE INVENTION

The field of rapid thermal processing (RTP) has dealt mainly with the uniformity of heating of the semiconductor wafers treated in the RTP systems. RTP systems generally have a chamber with at least one wall transparent to radiation from sources of radiation such as lamps. The object to be processed is placed in the chamber and irradiated with radiation from the radiation source so that the object is heated. The chamber with the transparent wall is not strictly necessary in the system, provided that the system controls the atmosphere in which the object is placed during processing. The lamps could then be placed in proximity to the object without the intervening window. Much progress has been made in using batteries of lamps with individual control of each lamp to increase uniformity of the illuminating radiation. The uniformity is now sufficient that very thin layers of oxide or nitride may be grown on a silicon wafer in a few seconds.

As silicon integrated circuits are made smaller and smaller, the requirements for the gate dielectrics in MOS field effect transistors grow more stringent. With smaller linewidths, higher speeds and lower power supply voltages; the dielectric in the gate must be made ever thinner. The traditional dielectric material, silicon dioxide ($SiO_2$) is no longer adequate. The electrical leakage is too high for $SiO_2$ dielectrics much below 4 nm in physical thickness. The silicon dioxide also does not prevent boron from diffusing from the heavily doped polysilicon gate electrode through the dielectric and into the channel region of the device. This causes a shift of the flatband voltage and oxide quality that severely degrades device performance. For these and other reasons, dielectrics with higher dielectric constants ("high-k dielectrics") and dielectrics which contain species which prevent Boron penetration have been desired. With a higher dielectric constant coefficient, the physical thickness of the layer can be increased for a given equivalent electrical thickness (measured by capacitance). This makes processing easier, provides more resistance to boron penetration and improves other electrical properties such as leakage.

One approach to forming higher k layers and Boron penetration resistant layers has been to add nitrogen to the silicon dioxide film, also called a nitrided oxide. Many processes have been described to form a nitrided oxide including annealing the oxide layer in ammonia, growing the film in nitrous oxide ($N_2O$) rather than oxygen, annealing an oxide in nitric oxide (NO), etc. All of these techniques have been shown to have various disadvantages including the location of the nitrogen within the film, high thermal budgets and lack of control and repeatability. In particular, nitrogen is found at the interface between the silicon and the silicon dioxide dielectric, which causes a shift in the flat band voltage. The present invention is a film and a process of making the film to form a nitride/oxide stack layer with desirable properties that overcomes the difficulties of prior methods.

RELATED APPLICATIONS

Reactors based on the RTP principle often have the entire cross section of one end of the reactor chamber open during the wafer handling process. This construction has been established because the various wafer holders, guard rings, and gas distribution plates, which have significantly greater dimensions and may be thicker than the wafers, must also be introduced into the chamber and must be easily and quickly changed when the process is changed or when different wafer sizes, for example, are used. The reaction chamber dimensions are designed with these ancillary pieces in mind. U.S. Pat. No. 5,580,830 teaches the importance of the gas flow and the use of an aperture in the door to regulate gas flow and control impurities in the process chamber.

The importance of measuring the temperature of the wafer using a pyrometer of very broad spectral response is taught in U.S. Pat. No. 5,628,564.

The wafer to be heated in a conventional RTP system typically rests on a plurality of quartz pins which hold the wafer accurately parallel to the reflector walls of the system. Prior art systems have rested the wafer on an instrumented susceptor, typically a uniform silicon wafer. Copending patent application Ser. No. 08/537,409 teaches the importance of susceptor plates separated from the wafer.

Rapid thermal processing of III–IV semiconductors has not been as successful as RTP of silicon. One reason for this is that the surface has a relatively high vapor pressure of, for example, arsenic (As) in the case of gallium arsenide (GaAs). The surface region becomes depleted of As, and the material quality suffers. Copending patent application Ser. No. 08/631,265 supplies a method and apparatus for overcoming this problem.

A method of raising the emissivity of a lightly doped, relatively low temperature wafer by locally heating the wafer with a pulse of light is disclosed in copending application Ser. No. 08/632,364.

A method, apparatus, and system for RTP an object is disclosed in copending application Ser. No. 08/953,590, filed Oct. 17, 1997, by Lerch et al.

A method of RTP of a substrate where a small amount of a reactive gas is used to control the etching of oxides or semiconductor is disclosed in copending application Ser. No. 08/886215, by Nenyei et al, filed Jul. 1, 1997.

A method of RTP of a substrate where evaporation of the silicon is controlled is disclosed in copending application Ser. No. 09/015,441, by Marcus et al. filed Jan. 29, 1997.

Methods of rotating the wafer in an RTP system are disclosed in applications Ser. Nos. 08/960,150 and 08/977,019 by Blersch et al. and Aschner et al. filed on Oct. 29, 1997 and Nov. 24, 1997 respectively.

The above identified applications are assigned to the assignee of the present invention and are hereby incorporated herein by reference.

SUMMARY OF THE INVENTION

A film is attached to a silicon or silicon-germanium substrate which has a graded layer of silicon oxynitride, wherein the oxygen content of the layer is substantial at the interface between the film and the substrate, and the nitrogen content of the layer increases with distance from the interface, has been shown to be an improved gate dielectric film. The method of producing such a film is to rapidly thermal process a clean wafer in an atmosphere of a nitrogen containing gas and a very small admixture of an oxygen containing gas. An even more improved film results when the RTP system is then flushed and the process gas replaced with a nitrous oxide gas, and the film is annealed by RTP.

The resulting nitride/oxide stack film has an effective oxide electrical thickness (Teff) of about 25 to 45Å with excellent electrical properties. It shows a leakage current density of almost two orders of magnitude less than a control silicon dioxide film. The flatband voltage is almost identical to the control oxide that indicates that the peak nitrogen concentration is within the film rather than at the oxide-silicon interface as is the case with other processes for nitriding oxides.

DETAILED DESCRIPTION OF THE INVENTION

Figure 1:
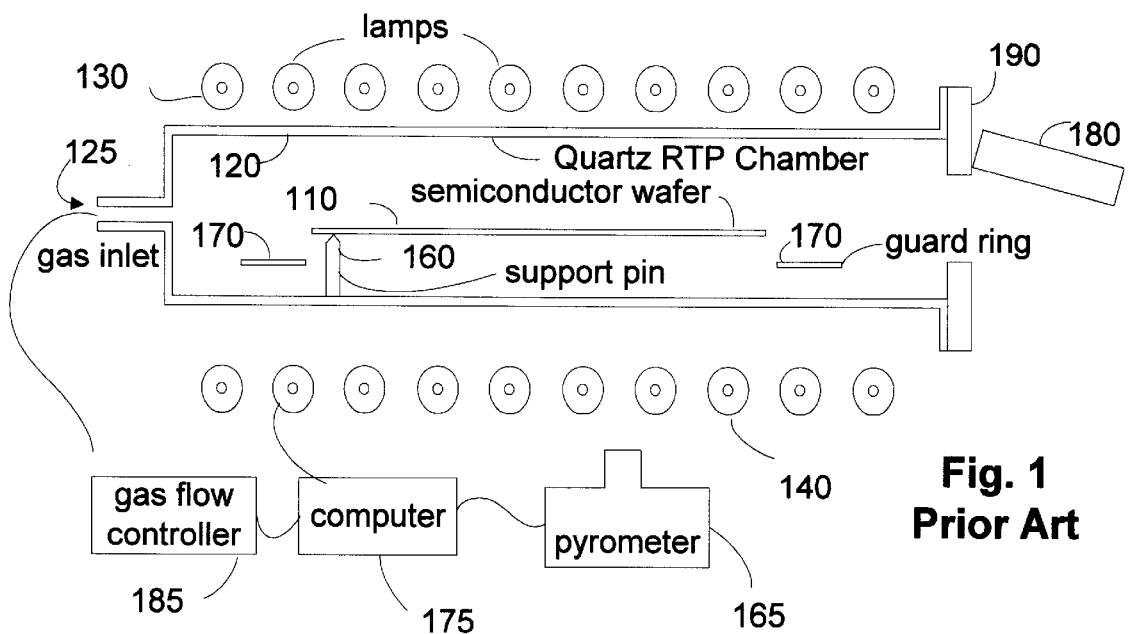
FIG. 1 shows a prior art RTP processing system.

FIG. 1 shows a prior art RTP processing system. A semiconductor wafer 110 or other object to be processed is supported in a quartz RTP chamber 120 by quartz support pins 160 (only one shown). A guard ring 170 is used to lessen edge effects of radiation from the edge of the wafer 110. An end plate 190 seals to the chamber 120, and a door 180 allows entry of the wafer 110 and, when closed, allows the chamber to be sealed and a process gas 125 to be introduced into the chamber. Two banks of radiation sources 130 and 140 are shown on either side of the wafer 110. Radiation sources 130 and 140 are typically quartz halogen lamps which produce visible and near infrared light which heat the semiconductor wafer 110. In the present invention, lamps 130 may be vapor lamps such as mercury vapor lamps which have a significant ultraviolet light output to enhance the chemical reactions taking place in the chamber. A computer 175 or other control means as are known in the art is used to control the lamps 130 and 140, and to control the gas flow controller 185, the door 180, and the temperature measuring system, denoted here as a pyrometer 165. The gas flow may be an inert gas which does not react with the wafer, or it may be a reactive gas such as oxygen or nitrogen which reacts with the material of the semiconductor wafer to form a layer of on the semiconductor wafer, or the gas flow may be a gas which may contain a silicon compound which reacts at the heated surface of the object being processed to form a layer on the heated surface without consuming any material from the surface of the object. When the gas flow reacts to form a layer on the surface, the process is called rapid thermal—chemical vapor deposition (RT-CVD). An electrical current may be run through the atmosphere in the RTP system to produce ions which are reactive with or at the surface, and to impart extra energy to the surface by bombarding the surface with energetic ions.

Figure 2:
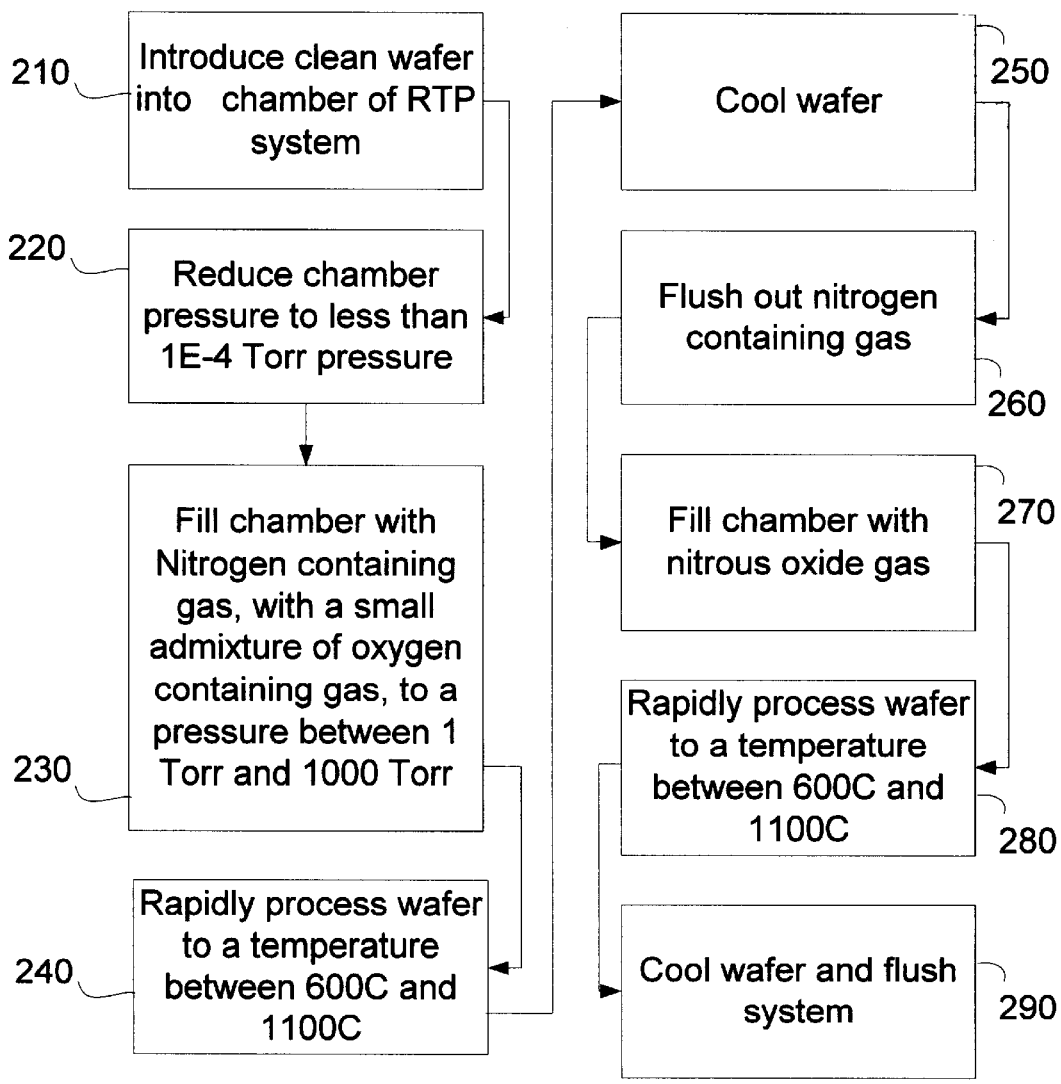
FIG. 2 shows a flow chart of the process of the invention.

FIG. 2 shows a flow chart of the method of the invention. A clean silicon wafer is placed into a rapid thermal process chamber in step 210. It is preferable that the silicon wafer is cleaned by dipping in dilute HF, and that the wafer be transferred from the HF dip into the process chamber rapidly enough that the silicon surface is passivated by fluorine atoms and hence no native oxide grows on the silicon surface during the transfer. It is preferable that the chamber be capable of reduced pressure (vacuum) operation. The chamber is pumped down to approximately below $10^{-4}$ Torr pressure in step 220 to ensure that the process gas is well controlled and not contaminated by gas left in the chamber from a previous step. A first nitrogen containing gas such as ammonia gas and a very small amount of a first oxygen containing gas in the concentration range of 1 to 5000 ppm, is introduced into the chamber in step 230 and the total gas pressure is increased and controlled between $10^{-3}$ Torr and 1 atmosphere or slightly above one atmosphere. It is most preferable that the first nitrogen containing gas does not contain oxygen, in order that the partial pressure of oxygen containing gas be well controlled. The first nitrogen containing gas is preferably nitrogen, more preferably a gas mixture of nitrogen and hydrogen, and most preferably ammonia gas. Other nitrogen containing gases and gas mixtures will be obvious to one skilled in the art and may be found by normal experimentation. The first oxygen containing gas may be chosen from the group consisting of oxygen, ozone, nitrous oxides nitric oxide, and water vapor. Once again, the first oxygen containing gas may be modified or changed or admixed by one of skill in the art to find optimal material and concentration. The most preferred first oxygen containing gas is oxygen. The preferred concentration of oxygen is less than 10,000 ppm. Even more preferred is a concentration of less than 1000 ppm. The most preferred concentration is between 10 ppm and 200 ppm. In step 240, the wafer in the atmosphere of the first nitrogen and the first oxygen containing component is rapidly processed to a high temperature, preferably between 600 and 1100° C. and most preferably between 650 and 750 C., and held at that temperature for 1 to 60 seconds. The wafer is allowed to cool in step 250, and the chamber is then pumped to a low pressure or flushed in step 260 to remove the ammonia. While the wafer produced after step 250 has been found to have an improved dielectric layer over the prior art processes, an additional inventive step has been found that further improves the dielectric layer. A second oxygen containing gas such as oxygen, nitric oxide, nitrous oxide, ozone, or other oxygen containing gas which will now be obvious to one of skill in the art, is introduced into the chamber in step 270. The most preferred second oxygen containing gas is nitrous oxide. The pressure is again raised and controlled between $10_{-3}$ Torr and 1 atmosphere while the wafer is most preferably heated to between 600 and 1100° C. for 1 to 60 seconds in step 280. The wafer is then cooled and the chamber purged with an inert gas such as nitrogen in step 290.

Figure 3:
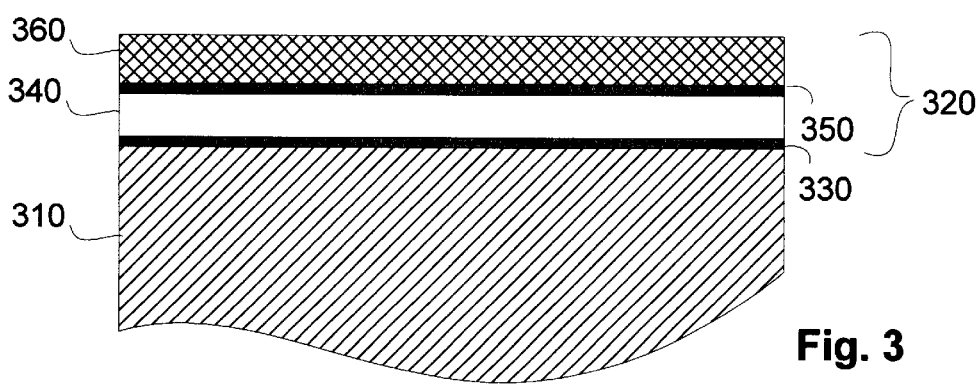
FIG. 3 shows a sketch of the film of the invention.

FIG. 3 shows a sketch of the resulting nitride/oxide stack film, which has an effective electrical thickness ($T_{eff}$) of about 25 to 45Å with excellent electrical properties. The effective electrical thickness of a film is the thickness of silicon dioxide which would have the same capacitance per unit area. A silicon or silicon-germanium substrate 310 is covered with a layer 320. A layer 330 is a graded layer where the composition of the film changes from being mostly oxide to mostly nitride. Layer 340 is a layer which is a mostly silicon nitride layer, which may have a significant oxygen content. An optional layer 350 is shown which may have increased oxide content over layer 340. A conducting gate electrode layer 360 is shown which would be used to complete the structure of a silicon device. The conducting layer 360 is typically polysilicon which has been heavily doped with boron. The layer 320 is mostly silicon dioxide. There is no pile up of nitrogen at the interface of layer 320 and substrate 310. Preferably, there should be less than $5 \times 10^{14}$ nitrogen atoms/cm$^2$ at the interface between the substrate and layer 320. Even more preferably, there should be less than $1 \times 10^{14}$ nitrogen atoms/cm$^2$ at the interface. Neither is there a layer of boron which has diffused from the boron doped polysilicon gate layer 360. The layer 320 may be only one, two, or three monolayers deep of silicon dioxide. The layers 320, 330, 340, and 350 together form a stack which is preferably less than 10 nm effective thickness.

The stack has more preferably less than 5 nm effective thickness, even more preferably less than 3 nm effective thickness, and most preferably less than 2 nm effective thickness. The preponderance of oxide and the lack of nitrogen at the silicon dielectric interface is shown by the fact that the flat band voltage of the experimental films is identical to the control oxide films. The preponderance of nitride in the entire film is shown by the dielectric constant of the film and by the fact that boron does not diffuse through the film to the interface.

Figure 4:
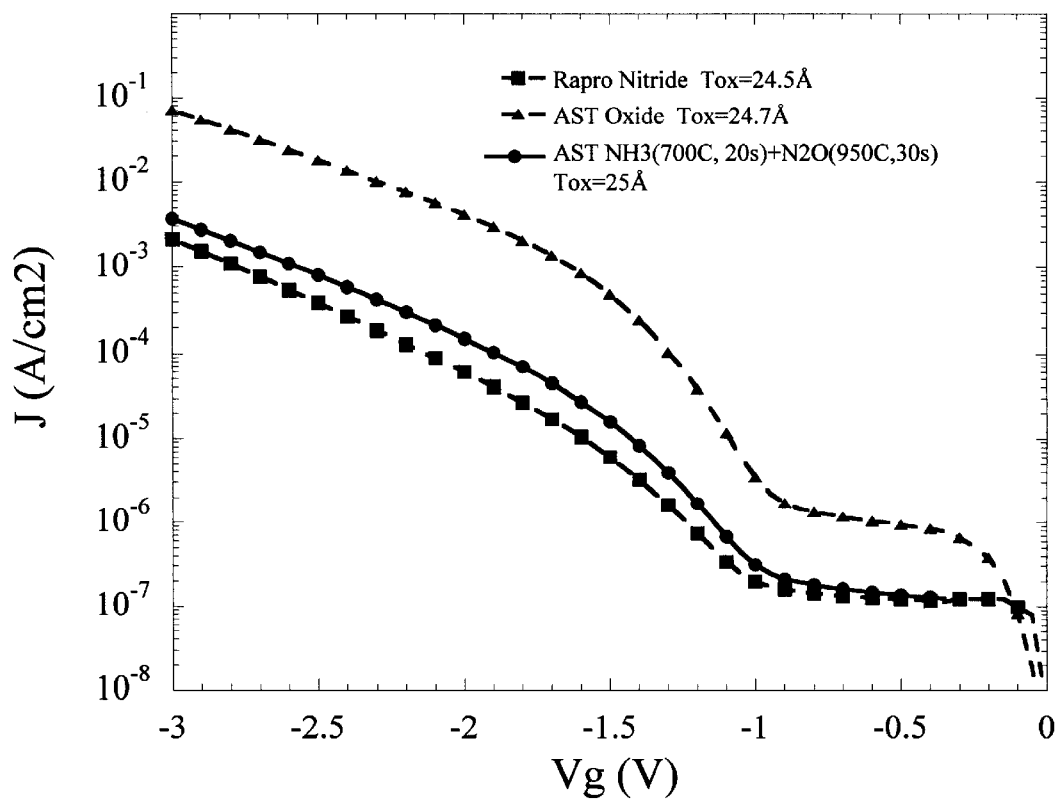
FIG. 4 shows a graph of measured current leakage as a function of voltage impressed across the film of FIG. 3.

FIG. 4 shows a plot of the leakage current density of the film versus voltage. The leakage current of the invention of almost two orders of magnitude less than a control silicon dioxide sample of the same effective thickness. The measured flatband voltage of the film of the invention is almost identical to the control oxide, which indicates that the peak nitrogen concentration is within the film rather than at the oxide-silicon interface as is the case with other processes for nitriding oxides.

Obviously, many modifications and variations of the present invention are possible in light of the above teachings. It is therefore to be understood that, within the scope of the appended claims, the invention may be practiced otherwise then as specifically described.

We claim:

1. A method of preparing a silicon, oxygen and nitrogen containing film on a substrate comprising silicon, comprising;
   a) introducing the substrate into a process chamber of a rapid thermal processing (RTP) system;
   b) contacting the substrate with a first reactive gas, the first reactive gas comprising a first nitrogen containing component and a first oxygen containing component, the first oxygen containing component having much smaller concentration that the first nitrogen containing component: and
   c) rapidly raising the temperature of the substrate to a first temperature for a first time
   d) lowering the temperature of the substrate;
   e) flushing the process chamber;
   f) contacting the substrate with an second reactive gas, the second reactive gas comprising a second oxygen containing component; and
   g) rapidly raising the temperature of the substrate to a second temperature for a second time.

2. The method of claim 1, wherein the first nitrogen containing component is a non oxygen containing component.

3. The method of claim 2, wherein the first nitrogen containing component is ammonia.

4. The method of claim 1, wherein the first oxygen containing component is present in the reactive gas in a concentration less than 10,000 ppm.

5. The method of claim 4, wherein the first oxygen containing component is present in the reactive gas in a concentration less than 1000 ppm.

6. The method of claim 5, wherein the first oxygen containing component is present in the reactive gas in a concentration less than 100 ppm.

7. The method of claim 1, wherein the first oxygen containing component is chosen from the group consisting of oxygen, ozone, nitrous oxide, nitric oxide, and water vapor.

8. The method of claim 7, wherein the first nitrogen containing component is ammonia.

9. The method of claim 8, wherein the second oxygen containing component is nitrous oxide.

10. The method of claim 1, additionally comprising:
   irradiating the substrate with ultraviolet electromagnetic radiation during step c).

* * * * *